(12) United States Patent
Blackwell

(10) Patent No.: US 6,905,370 B2
(45) Date of Patent: Jun. 14, 2005

(54) HOT PLUGGABLE ADAPTER FOR LEGACY POWER SUPPLY CONNECTORS

(75) Inventor: Donald A. Blackwell, Saratoga, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 10/763,310

(22) Filed: Jan. 23, 2004

(65) Prior Publication Data

US 2004/0229513 A1 Nov. 18, 2004

Related U.S. Application Data (60) Provisional application No. 60/508,334, filed on Oct. 2, 2003, and provisional application No. 60/470,582, filed on May 15, 2003.

(51) Int. Cl.[7] .............................................. H01R 25/00
(52) U.S. Cl. .......................................... 439/638; 439/61
(58) Field of Search ........................... 439/59, 61, 638, 439/641, 668, 669; 361/728, 729, 730

(56) References Cited

U.S. PATENT DOCUMENTS

| | | | |
|---|---|---|---|
| 5,691,504 A | | 11/1997 | Sands et al. |
| 6,089,892 A | * | 7/2000 | Snow et al. ................. 439/217 |
| 6,493,233 B1 | | 12/2002 | De Lorenzo et al. |
| 6,741,477 B2 | | 5/2004 | Sivertsen |
| 6,843,689 B2 | * | 1/2005 | Coniff ......................... 439/638 |

* cited by examiner

Primary Examiner—Khiem Nguyen
(74) Attorney, Agent, or Firm—Workman Nydegger (57) ABSTRACT

An adapter for use with existing network tap modules to be received by a housing that supports hot-pluggable modules. The adapter allows an existing network tap module to connect to a power supply connector and power supply included with a housing for network tap modules. The housing allows the user to maintain all network taps in any given system in one housing and location. This increases the ease of maintaining multiple network taps and allows the network tap modules to be powered by a power supply included with the housing. The adapter allows use of the housing with existing network tap modules, eliminating any need to replace existing modules in order to use the housing.

8 Claims, 12 Drawing Sheets

HOT PLUGGABLE ADAPTER FOR LEGACY POWER SUPPLY CONNECTORS

RELATED APPLICATIONS

The present application claims priority to U.S. Provisional Patent Application Ser. No. 60/470,582, with a filing date of May 15, 2003 entitled "HOT PLUGGABLE ADAPTER FOR LEGACY POWER SUPPLY CONNECTORS," and U.S. Provisional Patent Application Ser. No. 60/508,334, with a filing date of Oct. 2, 2003 entitled "HOT PLUGGABLE ADAPTER FOR LEGACY POWER SUPPLY CONNECTORS," each of which is incorporated herein by reference in its entirety.

BACKGROUND OF THE INVENTION

2. The Field of the Invention

The present invention relates to electrical adapters. More specifically, the present invention relates to adapters for enabling legacy network tap modules to be used with a housing that is otherwise designed for use with hot-pluggable network tap modules.

3. The Relevant Technology

In recent years, it has become increasingly important to have the ability to monitor (and analyze the data flow in communication channels between and within networks. Some of these reasons include monitoring the communication channel for certain types of data, identifying and diagnosing network problems, detecting interruptions in the communication channel, detecting degradation in the communication channel, and the like. Thus, network taps, which are systems for tapping into communication lines, have been developed. In general, a network tap is a device that is positioned in-line in a network communication line and enables network analyzers or other devices to have access to a copy of the data transmitted over the communication line. A network tap is typically installed by physically cutting or breaking a network cable and positioning the tap between the two ends of the network cable. Once the tap is installed, network analyzers or other devices can access the network data without having to manipulate the network cable or altering the topology of the network. Moreover, conventional network taps enable access to the network data without disrupting or modifying the network data or the topology of the network.

Systems using conductors composed of metallic materials such as copper or other low resistance metals have generally been relatively easy to monitor and evaluate without great disruption or intrusion into the communication channel since current flows throughout the entire conductor and portions of the conductor can be externally tapped with another conductor attached to the test equipment that bleeds off a negligible amount of test current.

Additionally, optical fibers that transmit light have also been used as a communication channel medium and have proven to be advantageous for the transmission of large amounts of information, both in digital and analog form. Optical fibers, unlike metallic conductors, propagate the information signal in a constrained directional path. Furthermore, the optical signal propagates primarily in a relatively narrow internal portion of the conductor, making non-intrusive external tapping of the fiber impractical. Therefore, in order to monitor data transmitted on an optical fiber, a splitter, also known as a coupler, must be placed in-line with the optical fiber to reflect a portion of the light from the main optical fiber to another optical fiber that can be coupled to a network analyzer or other test equipment.

Existing network taps typically are housed within a module including a faceplate through which various connections may be made. For example, the network tap module may include a set of in-line pass through connections to allow the tap to be positioned in line with the network (e.g. an "in" and "out" connection) in addition to one or more connections which allow a user to tap into the network for analysis purposes. Existing network tap modules also include a connector for receiving power, typically at the rear of the module.

Each network tap module allows the user to tap into the network at one specific location or on one selected cable or communication link between nodes in a network. Often, it is desirable to tap into the network at multiple communication links. To do this, a separate network tap must be inserted into each communication link to be accessed. Multiple taps also facilitate accessing and monitoring multiple channels that carry network data. Because each network tap module must be connected to a power supply, this can result in a system of network tap modules spread throughout a network, each module connected to its own power supply.

BRIEF SUMMARY OF THE INVENTION

The present invention relates to an adapter for use with existing network tap modules that are received by a housing that supports hot-pluggable modules. The adapter allows an existing network tap module to connect to a power supply connector and power supply included with a housing for network tap modules. The housing allows the user to maintain all network taps in any given system in one housing and location. This increases the ease of maintaining multiple network taps and allows the network tap modules to be powered by a power supply included with the housing. The adapter allows use of the housing with existing network tap modules, eliminating any need to replace existing modules in order to use the housing.

The housings are designed to be used with hot-pluggable network tap modules with power connectors positioned directly on the backplane of the housing. The housing has a depth dimension that permits the electrical connector of the hot-pluggable network taps to be connected directly to the corresponding electrical connector in the housing.

The new hot-pluggable network tap modules for which the housing has been specifically designed are longer than existing legacy network tap modules. This difference in length requires the use of the adapters of the invention, which permit existing legacy network tap modules, with the connected adapters, to be positioned within the housing.

According to one embodiment, the adapters include two power connectors. A first power connector is designed to plug into or otherwise connect with the power jack of the standard or legacy network tap module. The adapters of the invention enable the legacy network taps to be used without dedicated power cables and power supplies, while adapting the legacy network taps to be hot-pluggable to the electrical connectors provided within the housing. The second power connector is configured to connect to the power supply connector of the housing. The first and second power connectors of the adapter are electrically connected to one another. In use, the adapter allows power from the housing power supply to flow through the power supply connector, into the second power connector, the first power connector, and finally into the network tap module.

In another embodiment of the invention, a simplified adapter includes only two components, plus a mounting screw. This simplified adapter, according to this embodiment, replaces the two connectors discussed above. This simplification is accomplished by utilizing a very low cost barrel-style power plug adapter. This type of adapter is commonly used to convert wall-mount or desktop power supplies from one plug style to another. The rubber cover of the plug adapter is removed, and the power plug adapter can be pressed into an adapter block.

The adapter block is a plastic block that holds the power plug adapter and provides means to attach it to the legacy network tap module. Attachment of the adapter block to the network tap module may be by means of a single screw threaded through an existing fitting adjacent to the tap module power jack. The adapter block may optionally provide for the use of a guide pin and guide rails. While not a firm requirement, the use of a guide pin and guide rails allows a smooth engagement of the tap module in a housing with relaxed guide system tolerances. This arrangement offers a very cost effective solution in that both the guide pin and guide rails are low cost items.

These and other advantages and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by references to specific embodiments thereof, which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE INVENTION

The following paragraphs provide details regarding embodiments of an adapter for legacy power supply connectors. The adapter is for use with existing network tap modules that are received by a housing that supports hot-pluggable modules. The adapter allows an existing network tap module to connect to a power supply connector and power supply included with a housing for network tap modules. The housing allows the user to maintain all network taps in any given system in one housing and location. This increases the ease of maintaining multiple network taps and allows the network tap modules to be powered by a power supply included with the housing. The adapter allows use of the housing with existing network tap modules, eliminating any need to replace existing modules in order to use the housing.

1. Housing

Examples of housings that can be used according to embodiments of the invention are described in detail in U.S. Provisional Patent Application Ser. No. 60/470,610, entitled "HOUSING FOR HOT PLUGGABLE NETWORK TAPS", filed May 15, 2003; U.S. Provisional Patent Application Ser. No. 60/508,532, entitled "HOUSING FOR HOT PLUGGABLE NETWORK TAPS", filed Oct. 2, 2003; U.S. patent application Ser. No. 10/764,592, entitled "HOUSING FOR HOT PLUGGABLE NETWORK TAPS", filed on the same day as the present application; U.S. Provisional Patent Application Ser. No. 60/470,835, entitled "DISPLACEABLE CARD GUIDE FOR HIGH PACKING RATIO HOUSINGS", filed May 15, 2003; and U.S. patent application Ser. No. 10/764,045, entitled "DISPLACEABLE CARD GUIDE FOR HIGH PACKING RATIO HOUSINGS", filed on the same day as the present application, all of which are incorporated herein by reference.

Figure 1:
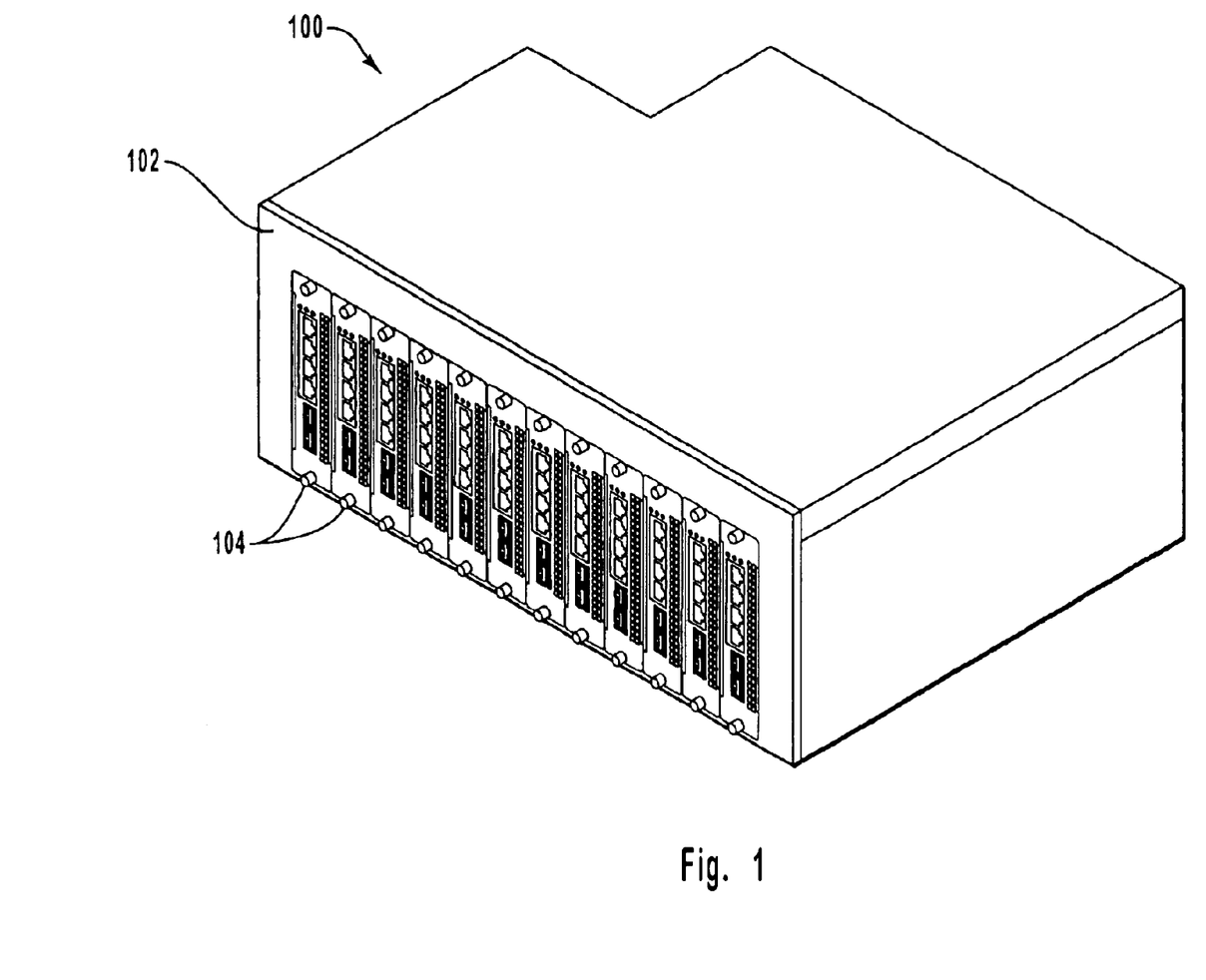
FIG. 1 is a perspective view of an embodiment of the housing of the present invention.
Figure 2:
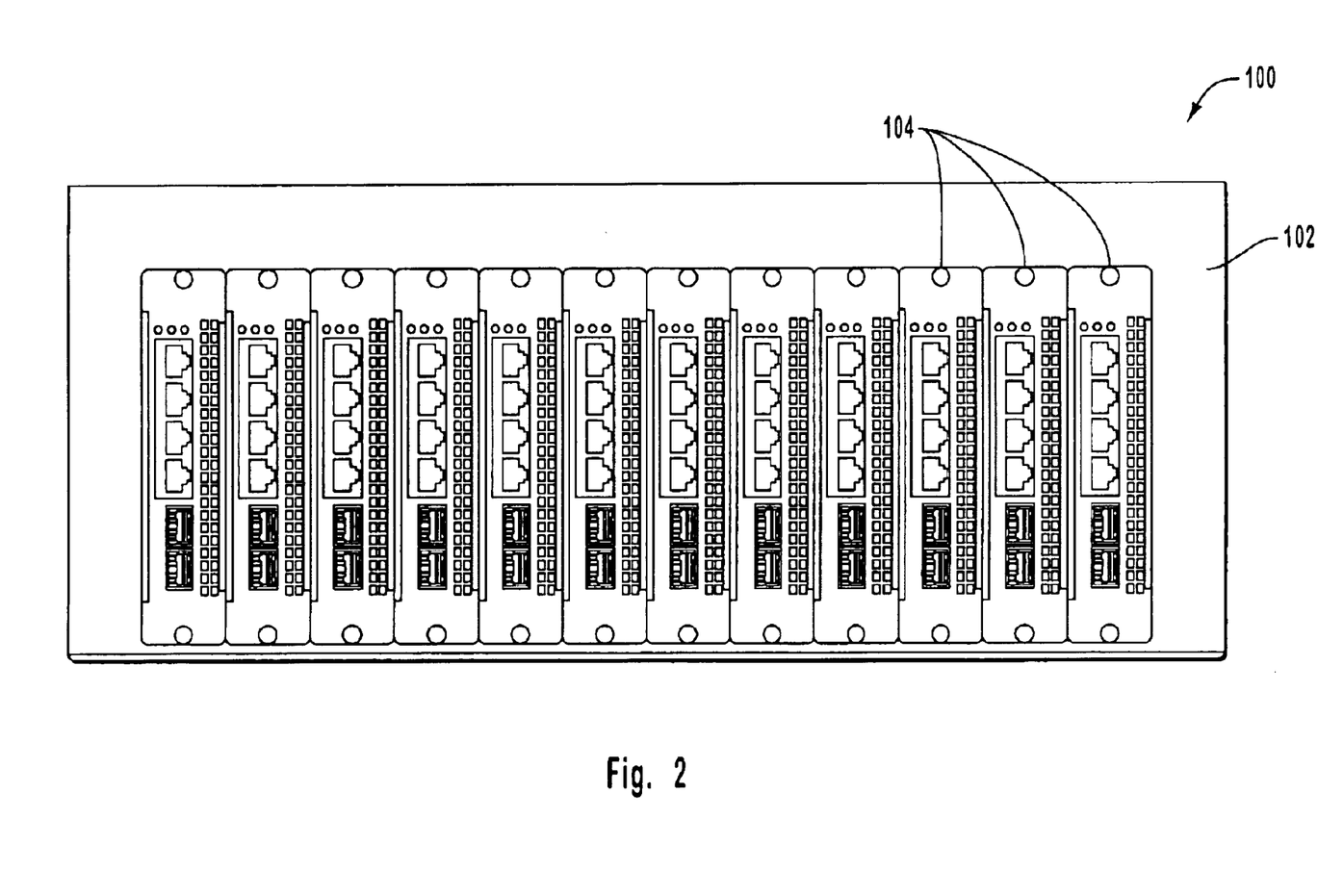
FIG. 2 is a front view of the embodiment of the housing of FIG. 1 with the housing filled with network tap modules.
Figure 3:
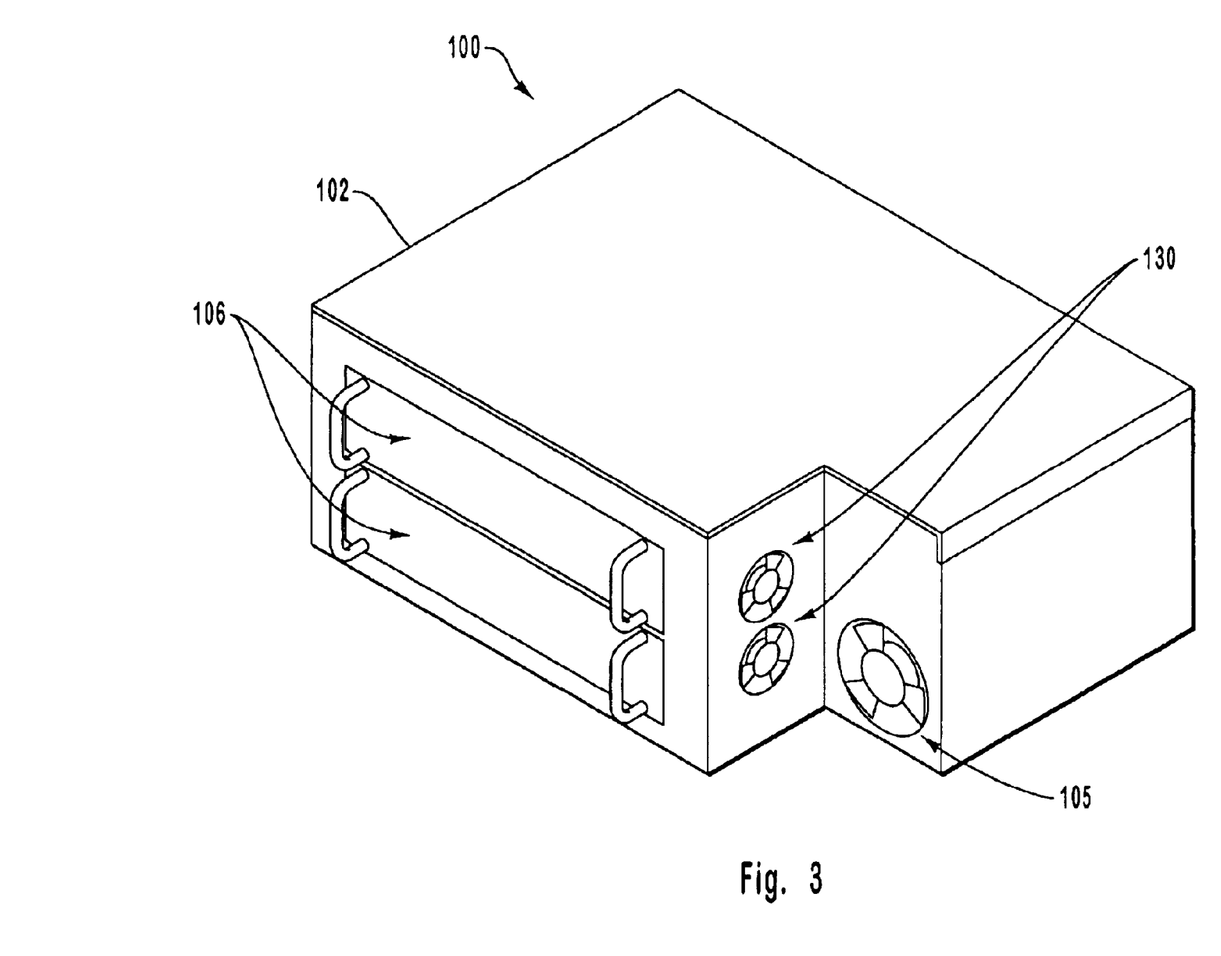
FIG. 3 is a rear perspective view of the embodiment of the housing of FIG. 1.

The housing 100 includes a chassis 102 for receiving a plurality of hot-pluggable network tap modules 104. The chassis 102 may be a rack or other structure that is capable of receiving or supporting several network tap modules 104. One currently preferred embodiment of the housing 100 includes a chassis 102 designed to receive up to 12 network tap modules 104 with little or no space between them, resulting in a high packing ratio. Such an embodiment is illustrated from various perspectives in FIGS. 1–3. The chassis 102 may also include one or more cooling fans 105 (seen in FIG. 3) or other means of cooling (e.g. heat sinks, etc). Cooling fans may be vented to the exterior of the housing 100.

The housing 100 provides a physical superstructure that can be used to fix the position of a set of network tap modules 104, which represents a significant improvement over conventional methods of managing a number of taps, which typically has involved stacking taps without a common housing or storing taps in different physical locations. Moreover, the housing 100 can be used to receive hot-pluggable network tap modules designed specifically for use with the housing 100 as well as existing legacy network tap modules.

Figure 4:
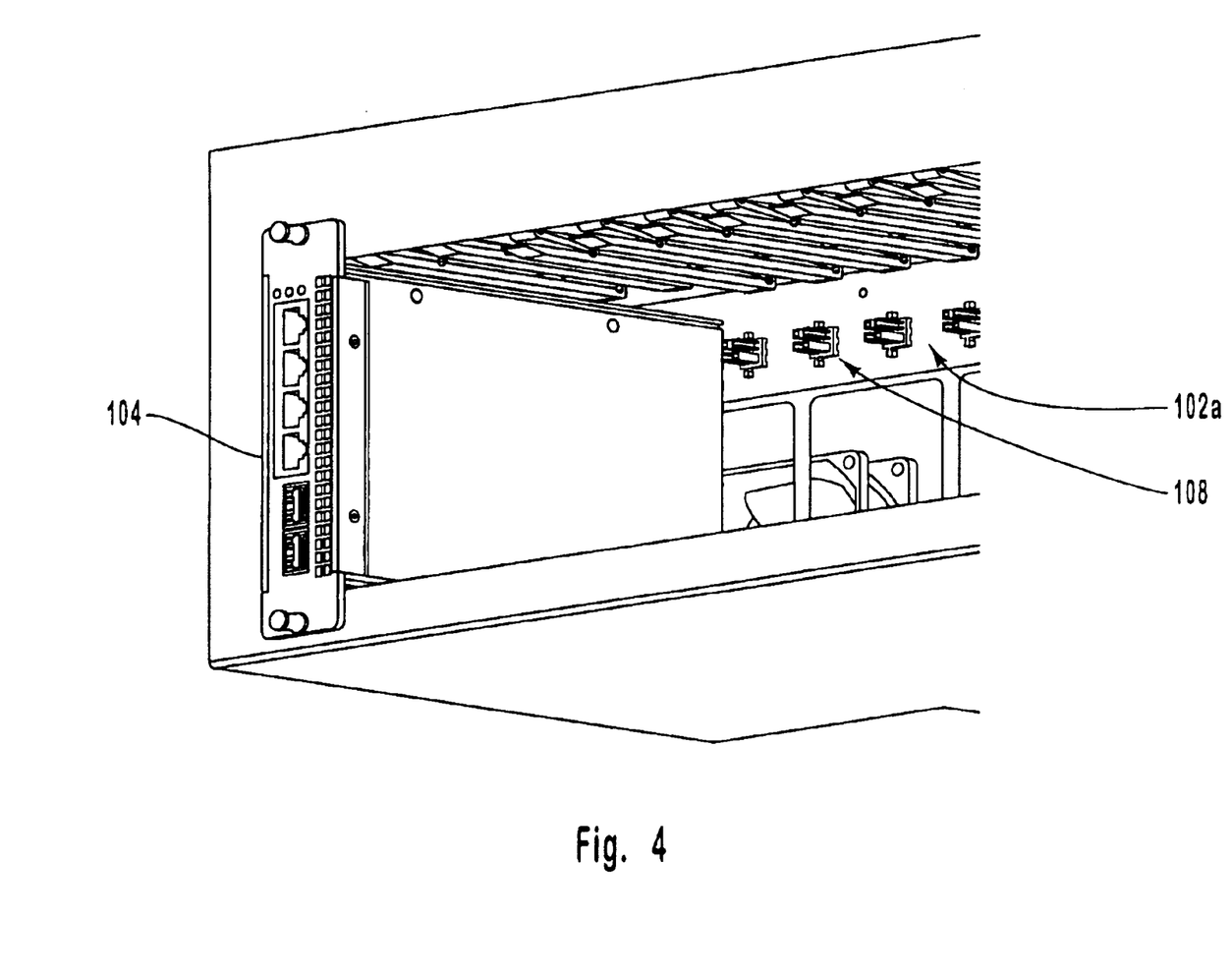
FIG. 4 is a front perspective view of the embodiment of the housing of FIG. 1 with the housing holding only one network tap module.
Figure 7:
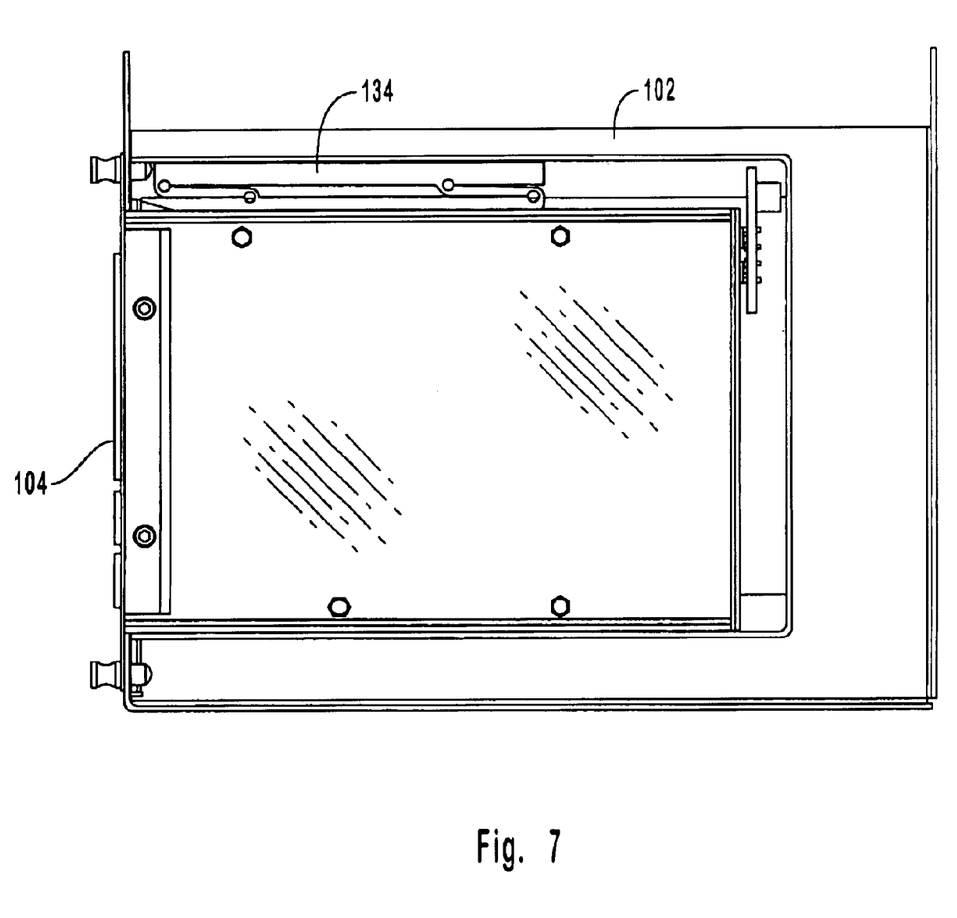
FIGS. 7 and 8 are cross sectional views through a portion of the housing of FIG. 1.
Figure 8:
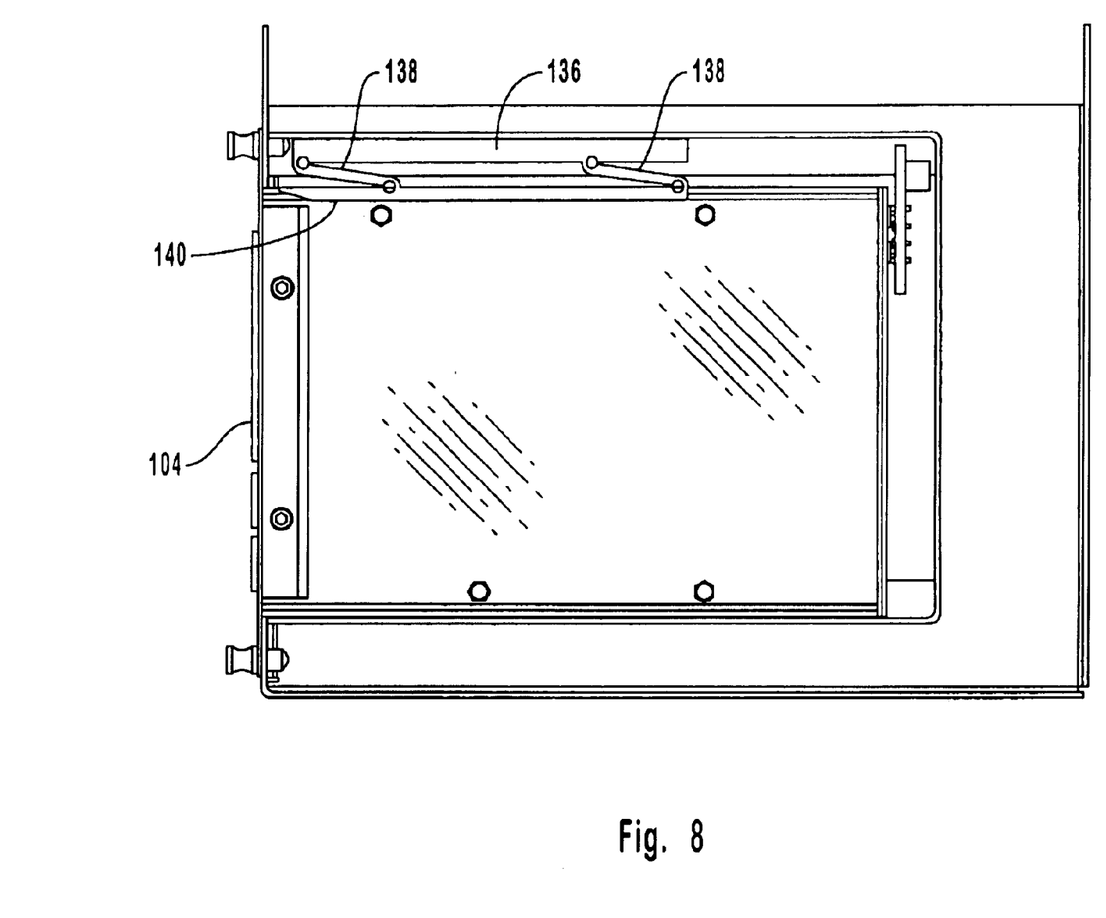

The housing 100 is designed to be used with hot-pluggable network tap: modules 104 with power connectors 108 positioned directly on the backplane 102a of chassis 102 as illustrated in FIG. 4. The housing 100 has a depth dimension (perhaps best seen in FIGS. 7–8) that permits the electrical connector of the hot-pluggable network tap 104 to be connected directly to the corresponding electrical connector 108 in the housing 100.

Figure 5:
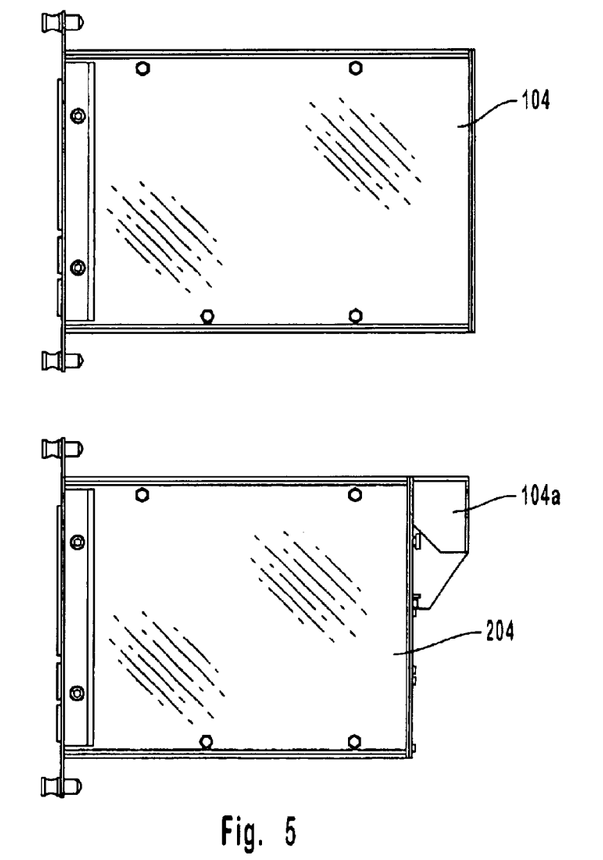
FIG. 5 is a side view of two embodiments of network tap modules.

As shown in FIG. 5, the new hot-pluggable network tap module 104 for which the housing 100 has been specifically designed is longer than the legacy network tap module 204. The difference in the lengths is accommodated by the use of the adapters of the invention, while still permitting the existing legacy network tap modules 204, with the connected adapters, to be positioned within the housing.

2. Adapters with Dual Connectors

Figure 6:
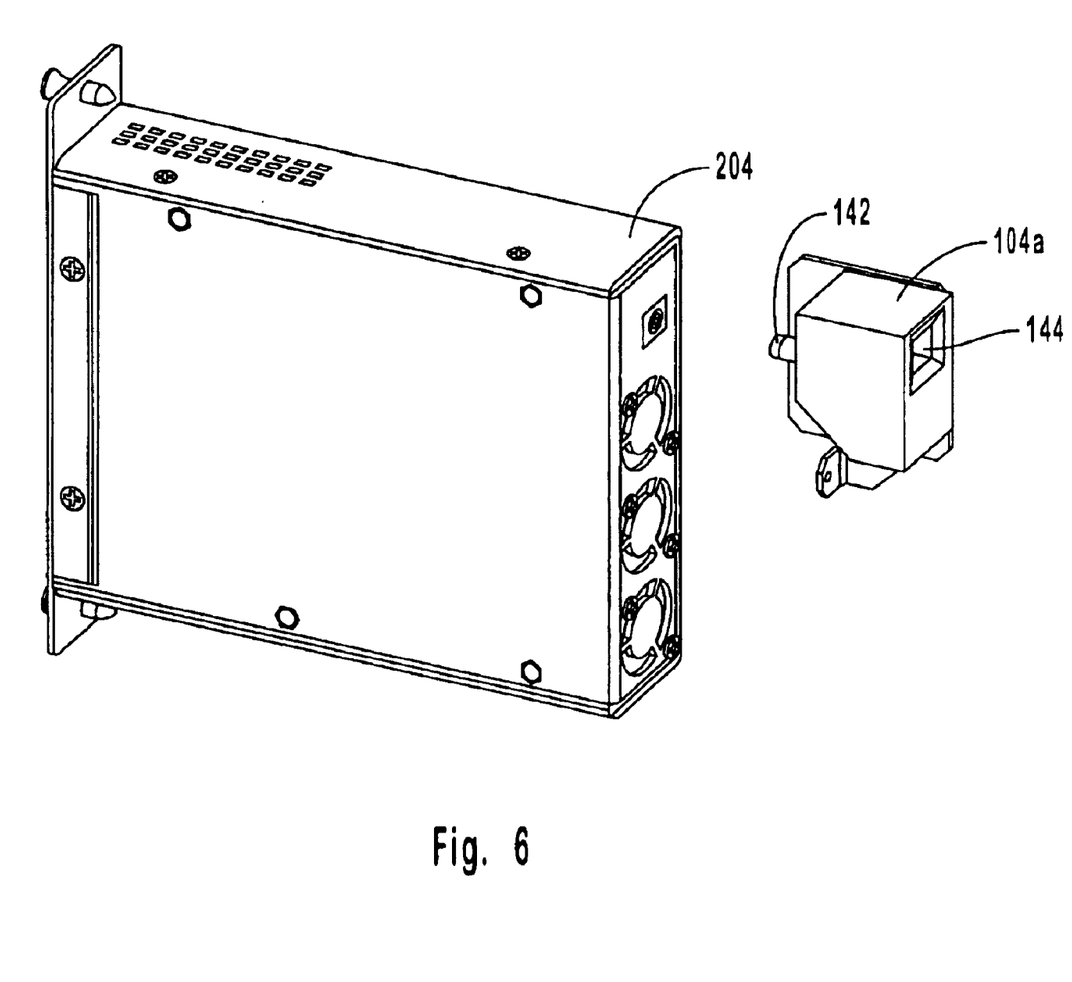
FIG. 6 is a perspective view of one of the network tap modules of FIG. 5.

One embodiment of the adapter 104a, as illustrated in FIGS. 5 and 6, includes two power connectors 142 and 144. A first power connector 142 is designed to plug into or otherwise connect with the power jack of the standard or legacy network tap module 204. In the absence of the adapter 104a, the power jack of the legacy network tap module 204 is used with a dedicated power cable and power supply and is not readily compatible for use in a housing 100 with other network tap modules 104 or 204. The adapters 104a enable the legacy network taps 204 to be used without their dedicated power cables and power supplies, while adapting the legacy network taps 204 to be hot-pluggable to the electrical connectors 108 provided within the housing 100.

The second power connector 144 is configured to connect to the power supply connector 108 of the housing 100. The first and second power connectors 142 and 144 of the adapter are electrically connected to one another. In use, the adapter 104a allows power from the housing power supply 106 to flow through the power supply connector 108, into the second power connector 144, the first power connector 142, and finally into the network tap module 204.

The first power connector 142 may be a standard male power connector designed to plug into or otherwise be received within the power jack of the existing network tap module 204. This first power connector 142 is electrically connected to a second power connector 144 also within the adapter housing 104a. The second power connector 144 may be a female power connector configured to connect to the power supply connector 108 attached to the housing 100 as seen in FIG. 4. The illustrated embodiments are not meant to be limiting, and any desired connectors may be used.

3. Simplified Adapters

Figure 9:
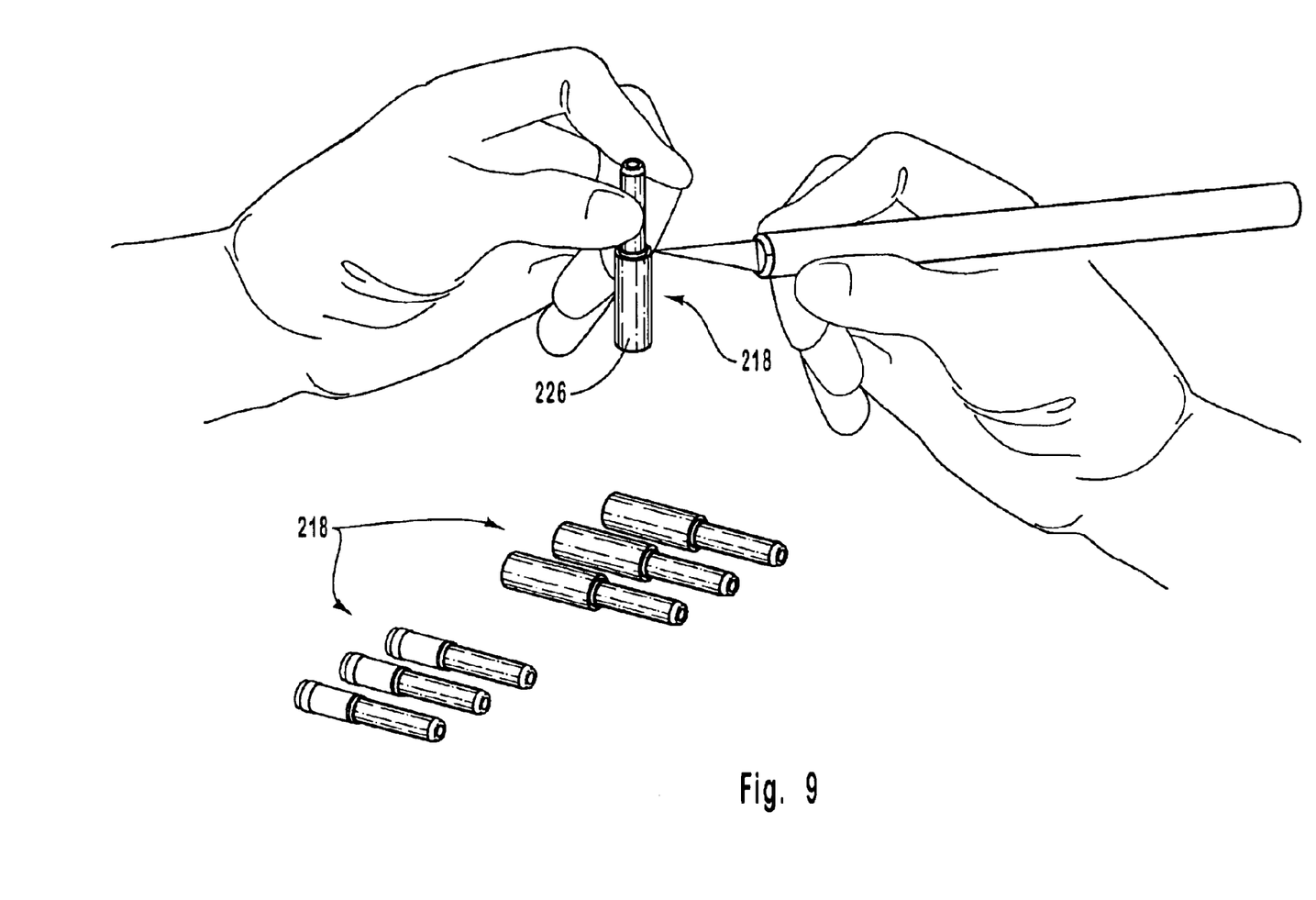
FIG. 9 is a perspective view of a jacket being removed from a barrel plug adapter.
Figure 10:
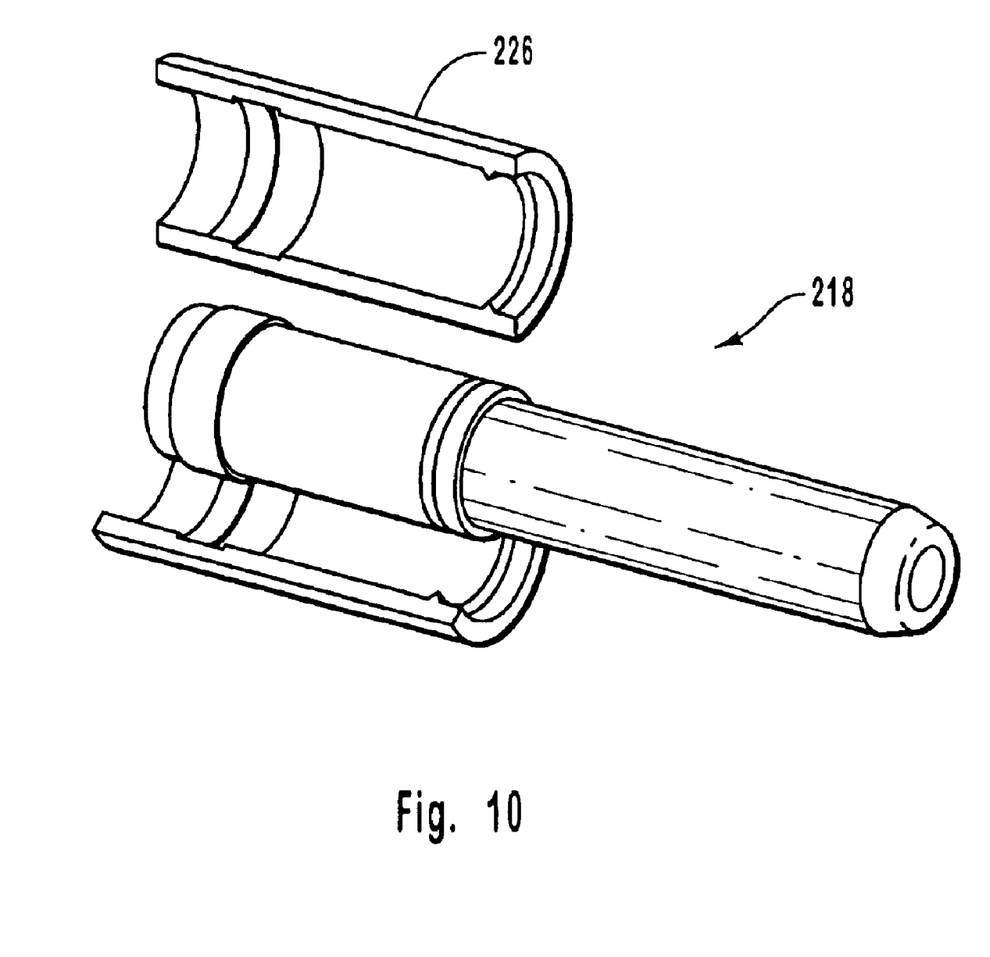
FIG. 10 is a perspective view of the barrel plug of FIG. 9 with the jacket removed.

In an alternative embodiment of the invention, a simplified adapter 104b includes only two components, plus a mounting screw. This simplified adapter, according to this embodiment, replaces the two connectors 142 and 144 above in reference to FIGS. 5 and 6. The simplified adapter also eliminates the need for the backplane printed circuit board assembly (PCBA) 102a. This simplification is accomplished by using a very low cost barrel-style power plug adapter. This type of adapter is commonly used to convert wall-mount or desktop power supplies from one plug style to another. In this case, the barrel adapter can be selected to convert a 5.5 mm×2.1 mm female barrel jack to a 5.5 mm×2.5 mm male barrel plug. As can be seen from the similarity in dimensions, the input and output vary only in the diameter of the center pin. The barrel style power plug adapter 218 as delivered has a rubber cover 226 that must be removed for use in the simplified adapter 104b. This is easily accomplished by slitting the cover 226 in two places and pulling the cover 226 from the power plug adapter 218 as shown in FIGS. 9 and 10.

Figure 11:
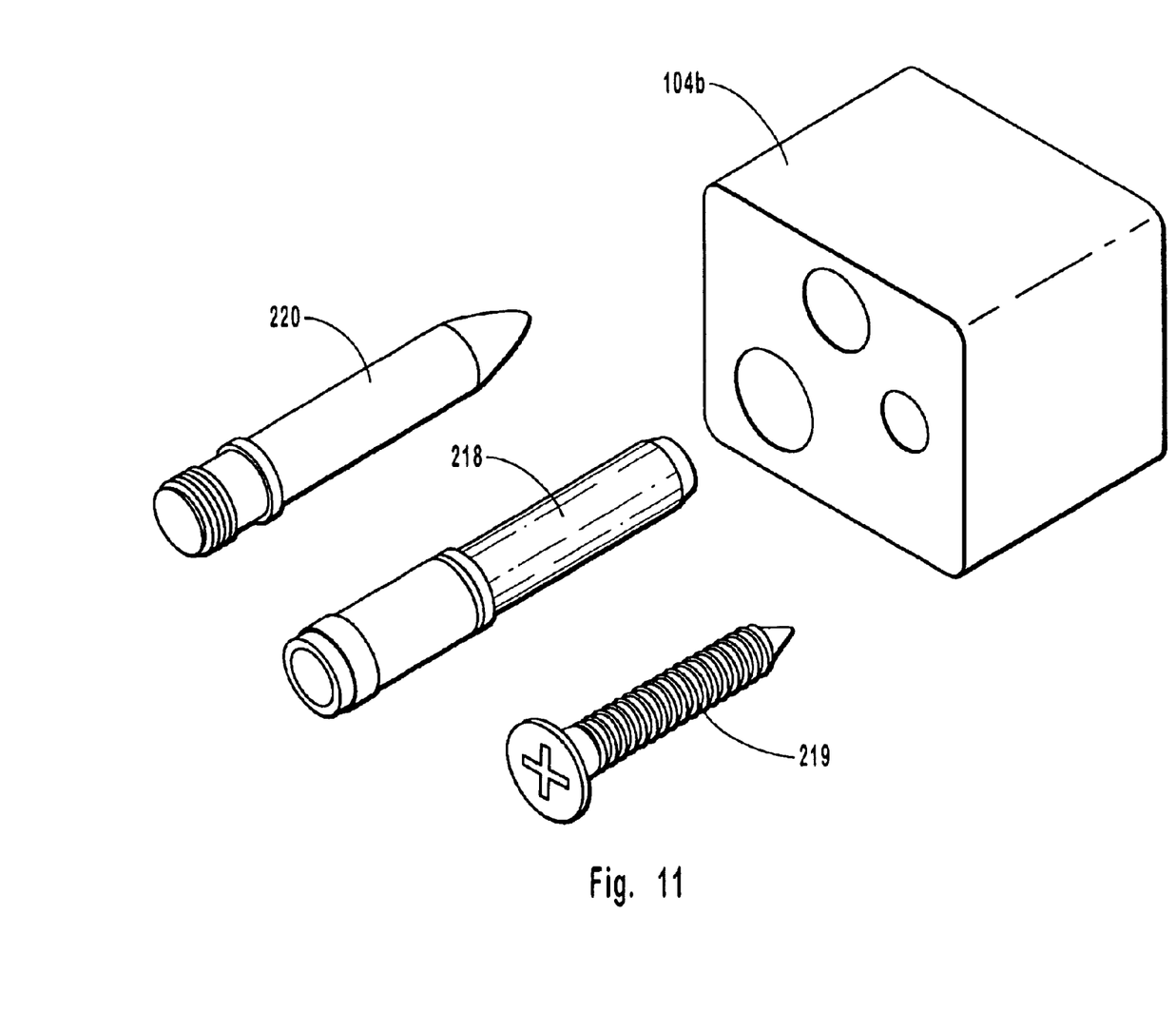
FIG. 11 is a perspective view of a barrel plug adapter to be inserted into an adapter block.

With the cover 226 removed, the power plug adapter 218 can be pressed into the simplified adapter block 104b as illustrated in FIG. 11.

Figure 12:
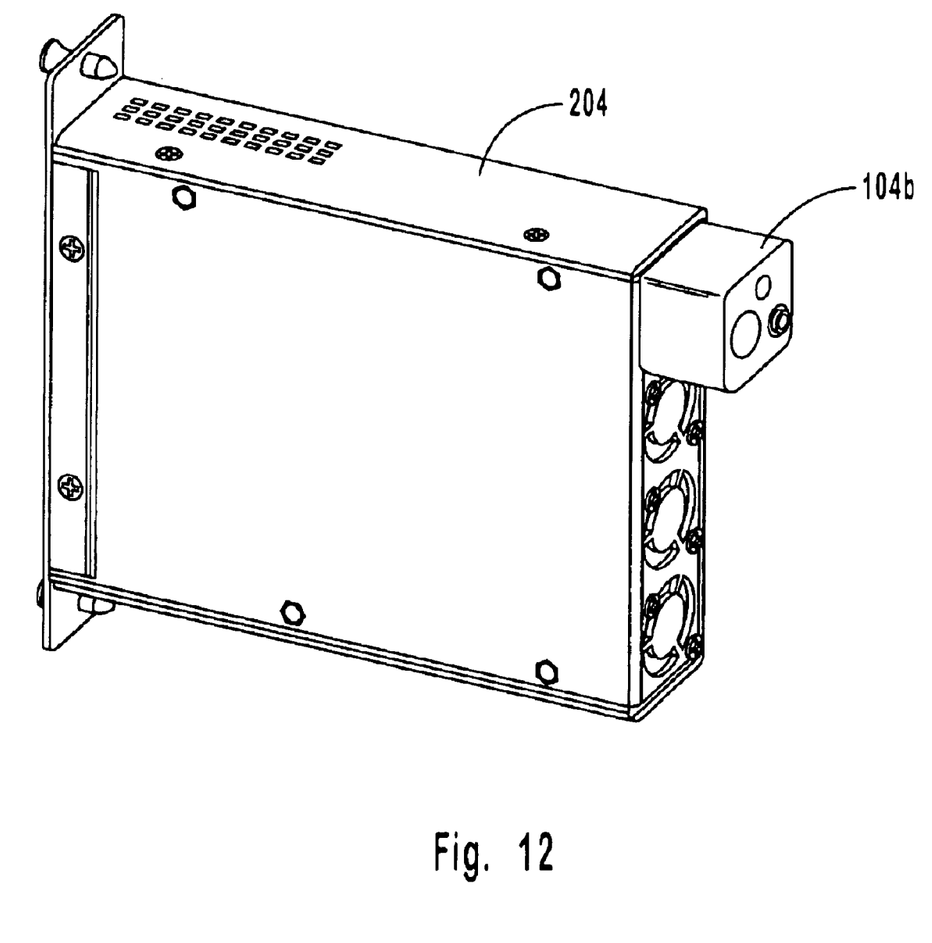
FIG. 12 is a perspective view of the adapter block of FIG. 11 attached to a legacy network tap module.

This plastic block adapter 104b holds the power plug adapter 218 and provides a means to attach it to the legacy network tap 204. In the current embodiment, this attachment is by means of a single screw 219 that is received through an existing threaded fitting adjacent to the network tap 204 power jack, as shown in FIG. 12.

The plastic adapter block 104b may also provide for the use of a guide pin 220. While not a firm requirement, the use of a guide pin 220 as employed in this embodiment allows a smooth engagement of the network tap 204 in a housing 200 with relaxed guide system tolerances. This arrangement offers a very cost effective solution in that both the guide pin 220 and guide rails 103 are low cost items.

4. Use of Adapters

As illustrated in FIG. 5, the adapter 104a allows existing network tap modules 204 to connect with power supply connectors 108 that are included in the housing 100 of FIGS. 1–4. The adapter 104a may be hot pluggable, meaning that when used with legacy network tap modules, the modules can be hot-pluggable and used without their dedicated power cables and power supplies. It will also be apparent from FIG. 5 that attaching the adapter 104a to a legacy network tap module 204 adds depth so that the combination of the module 204 and the adapter 104a has a depth equal to network tap modules 104 designed specifically to be used with the housing 100. The added depth helps the network tap modules mount correctly in the housing 100, including connecting to the power supply connectors 108 of the housing 100. In addition, the use of the adapters 104a avoids the space and inconvenience that would otherwise be experienced if an attempt were made to house a set of legacy network tap modules, each with its own dedicated power supply and corresponding power cables, within a single housing.

The invention also extends to a housing, such as the housing 100 illustrated in FIGS. 1–4, in which both legacy network tap modules 204 with the adapters 104a described herein and the longer, hot-pluggable network tap modules 104, are positioned and operated. The ability to use new or existing network tap modules is a significant advantage, and makes the acceptance of the illustrated housing 100 much easier, since the use of the housings 100 does not require the replacement of all existing network modules 204. While use of the adapters has been explained with respect to adapter 104a of FIG. 5, the simplified adapter 104b described herein also provides similar benefits.

While the invention has been disclosed herein in the context of network tap modules, the principles of the invention can also be applied to other pluggable modular electronics or optical components. It will also be appreciated that the present invention may be embodied in other specific forms without departing from its spirit or essential characteristics.

What is claimed is:

1. A hot-pluggable adapter to be used with a network tap module comprising:
   an adapter block; and
   a first power connector configured to connect to a power jack of a network tap module; and
   a second power connector configured to connect to a power supply connector of a housing for a plurality of network tap modules, wherein the first and second power connectors are electrically connected so as to allow power to flow from a housing power supply through a power supply connector, through the second power connector, the first power connector, and into a network tap module.

2. A hot-pluggable adapter as recited in claim 1, wherein the adapter block is a machined plastic part.

3. A hot-pluggable adapter as recited in claim 1, wherein the first and second power connectors comprise a barrel style plug adapter which is inserted into a hole of the adapter block.

4. A hot-pluggable adapter as recited in claim 3, further comprising a guide pin.

5. A hot-pluggable adapter as recited in claim 3, further comprising a screw for attaching the adapter to a network tap module.

6. A housing for receiving hot-pluggable network tap modules comprising:

a chassis for receiving a plurality of network tap modules;

a power supply for providing power to a plurality of power supply connectors, wherein each power supply connector is capable of providing power to a received network tap module;

a first network tap module received in the chassis, the first network tap module being connected directly to a corresponding one of the plurality of power supply connectors; and a second network tap module received in the chassis, the second network tap having a length that is shorter than a length of the first network tap module, the second network tap module being connected to a corresponding one of the plurality of power supply connectors using an adapter that compensates for the shorter length of the second network tap module.

7. A housing as recited in claim 6, wherein the adapter comprises:

an adapter block; and a first power connector connected to a power jack of the second network tap module; and a second power connector that is connected to the power supply connector of the housing that corresponds to the second network tap.

8. A housing as recited in claim 7, wherein the first and second power connectors are electrically connected so as to allow power to flow from the housing power supply through the power supply connector, through the second power connector, the first power connector, and into the second network tap module.

* * * * *